(12) United States Patent
Tu

(10) Patent No.: US 6,709,919 B2
(45) Date of Patent: Mar. 23, 2004

(54) METHOD FOR MAKING AUTO-SELF-ALIGNED TOP ELECTRODES FOR DRAM CAPACITORS WITH IMPROVED CAPACITOR-TO-BIT-LINE-CONTACT OVERLAY MARGIN

(75) Inventor: Kuo-Chi Tu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 97 days.

(21) Appl. No.: 10/146,450

(22) Filed: May 15, 2002

(65) Prior Publication Data

US 2003/0214872 A1 Nov. 20, 2003

(51) Int. Cl.[7] .......................................... H01L 21/8242
(52) U.S. Cl. ....................... 438/255; 438/253; 438/396; 438/397
(58) Field of Search ................................ 438/253, 254, 438/255, 256, 257, 258, 396, 397, 398

(56) References Cited

U.S. PATENT DOCUMENTS

| | | | | |
|---|---|---|---|---|
| 5,798,289 A | | 8/1998 | Ajika et al. ................. | 438/239 |
| 6,165,839 A | | 12/2000 | Lee et al. .................... | 438/253 |
| 6,221,711 B1 | * | 4/2001 | Roberts et al. ............. | 438/239 |
| 6,294,426 B1 | * | 9/2001 | Tu et al. ..................... | 438/255 |
| 6,348,411 B1 | * | 2/2002 | Ireland et al. .............. | 438/672 |
| 6,472,266 B1 | * | 10/2002 | Yu et al. ..................... | 438/241 |
| 6,503,796 B1 | * | 1/2003 | Tu ............................... | 438/255 |

* cited by examiner

*Primary Examiner*—Dung A Le
(74) *Attorney, Agent, or Firm*—George O. Saile; Stephen B. Ackerman

(57) ABSTRACT

Novel capacitor top electrodes auto-self-aligned to bit-line regions is achieved with improved process yields. A first insulating layer is formed over the FETs, and a second insulating layer is deposited. Openings are etched for capacitors, and a novel photomask and etching are used to recess the second insulator. A first conducting layer is deposited for bottom electrodes, and a second photoresist is used to remove the first conducting layer on the top surfaces of the second insulating layer. A thin dielectric layer is deposited, and a second conducting layer is deposited, and polished back to form novel auto-self-aligned top electrodes to the second insulating layer for bit-line contact openings. This increases overlay margins, and the recessing of the second insulating layer in the first openings prevents polish-back damage to the bottom electrodes.

31 Claims, 14 Drawing Sheets

METHOD FOR MAKING AUTO-SELF-ALIGNED TOP ELECTRODES FOR DRAM CAPACITORS WITH IMPROVED CAPACITOR-TO-BIT-LINE-CONTACT OVERLAY MARGIN

CROSS REFERENCE TO RELATED APPLICATIONS

This application is an improvement on a previous application Ser. No. 09/905817, files Aug. 16, 2001, now U.S. Pat. No. 6,503,796.

BACKGROUND OF THE INVENTION

(1) Field of the Invention

The present invention relates to a process for making capacitor-under-bit-line dynamic random access memory (DRAM) device structures having an improved capacitor top electrode design. (The top electrode is also commonly referred to as top-plate electrode.) More specifically, the process employs a novel mask design and a sequence of novel process steps for improving the overlay margin between the bit-line contacts and the capacitors' top electrodes. This method allows the capacitor top electrodes to be auto-self-aligned to the bit-line contacts for increased memory cell density.

(2) Description of the Prior Art

Dynamic random access memory (DRAM) circuits are used extensively in the electronics industry for storing data. The DRAM circuit includes an array of memory cells, each cell consisting of a single capacitor and a single transfer transistor. Typically the transfer transistor is a field effect transistor (FET). Binary data (1's and 0's) are stored as charge on the capacitors, and the transfer transistor is used to retain the charge. During the read cycle the transfer transistor is used to interrogate the cell by means of bit lines. Two types of memory cells that are commonly used include a cell having a trench capacitor formed in the substrate under the FETs, and a cell having a stacked capacitor that is built over and between FETs. In the fabrication of DRAM circuits having stacked capacitors, the capacitor can be formed over the bit lines, and is commonly referred to as Capacitors-Over-Bit lines (COB), or can be formed under the bit lines, commonly referred to as Capacitors-Under-Bit lines (CUB). For all of the DRAM structures described above, the number of memory cells on a DRAM chip has increased dramatically over the years, and that number of cells is expected to exceed 1 Gigabit. This increase is a result of the downsizing of feature size of the discrete devices using improved high-resolution photolithography, improved directional plasma etching, and self-aligning techniques, with a resulting increase in circuit density.

Numerous methods of making these higher density DRAM devices have been reported. For example, Lee et al. in U.S. Pat. No. 6,165,839 describe a method for fabricating CUB DRAMs using a sidewall spacer to separate and self-align the tungsten bit line structure from the capacitor top electrode. U.S. Pat. No. 6,294,426 to Tu et al describes a method for making a CUB without increasing the aspect ratio of the bit-line contact opening. In U.S. Pat. No. 5,798,289 to Ajika, a method is described for making COB and therefore does not address the problem of making bit-line contact openings between adjacent capacitors that are required for CUB.

Although downscaling of devices and self-aligning techniques have dramatically increased the memory cell density on DRAM chips, there is still a strong need in the industry to further improve the structure and process to provide a more reliable process with further increases in cell density. More specifically, it is highly desirable to improve the overlay margins between the capacitor top electrodes and the bit-line contacts on capacitor-under-bit line DRAM chips.

SUMMARY OF THE INVENTION

A principal object of the present invention is to form an array of closely spaced DRAM cells, with increased overlay margins between capacitor top electrodes and bit-line contacts, resulting in increased memory cell density for Capacitor-Under-Bit line (CUB) DRAM circuits.

Another objective of this invention is to achieve the improved overlay margin by using a novel process resulting in auto-self-aligned capacitor top electrodes to the region where the bit-line contacts are formed.

This novel memory cell structure consists of an array of stacked capacitors under bit lines that have an improved overlay margin between the bit-line contacts and the capacitor top electrodes. The method for making the array of memory cells begins by providing a semiconductor substrate having partially completed DRAM devices. The substrate is single-crystal-silicon doped with a P type conductive dopant, such as boron (B). Shallow trench isolation (STI) regions are formed surrounding and electrically isolating an array of device areas for memory cells on the substrate. To form the STI shallow trenches are etched in the substrate, and the trenches are filled with an insulating material, such as silicon oxide ($SiO_x$), and is polished back to the substrate to form a planar surface. These partially completed DRAMs also include word lines that extend over the device areas to form field effect transistors (FETs). Typically the FETs consist of a thin gate oxide on the device areas, and gate electrodes formed from a patterned polycide layer (word lines). The FETs also have source/drain areas, one on each side and adjacent to the FET gate electrodes.

A relatively thin conformal silicon nitride ($Si_3N_4$) barrier layer is formed over the device areas and over the STI regions to insulate the FET devices on the DRAM circuit. A first insulating layer is deposited on the substrate, and conducting first and second plug contacts are formed concurrently in the first insulating layer to contact the source/drain areas of the FETs. The conducting first plug contacts extend through the first insulating layer to the first source/drain areas for capacitors, and the conducting second plug contacts extend through the first insulating layer to the second source/drain areas for bit-line contacts. A second insulating layer is deposited, and first openings are formed in the second insulating layer aligned over the first conducting plug contacts.

A key feature of this invention is to deposit a first photoresist layer sufficiently thick to fill the first openings and to provide an essentially planar top surface over the substrate. The first photoresist layer is patterned to form second openings. Portions of the first photoresist are retained over the second plug contacts, and also extending over the edge of the first openings. The patterning is achieved by partially exposing the first photoresist through a photomask, and partially developing the photoresist. This patterning results in the first photoresist layer protecting the underlying second insulating layer over the second plug contacts (for the bit lines). The first photoresist in the second openings is recessed to expose the top surface of the second insulating layer. The exposed portions of the second insulating layer are then selectively and partially etched back to recess those portions below the top portions of the second insulating layer over the second plug contacts. The second insulating layer is recessed using plasma etching. The remaining first photoresist is removed, for example, by ashing. The capacitor bottom electrodes are formed in the first openings aligned over and contacting the first conducting plug contacts. The bottom electrodes are formed by depositing a conformal first conducting layer, such as a doped polysilicon layer, over the second insulating layer and in the first openings. To further increase the capacitance, a hemispherical silicon grain (HSG) layer can be formed on the polysilicon layer to increase the surface area. Then a second photoresist layer is deposited to fill the first openings and the recessed areas in the second insulating layer. The second photoresist is then partially exposed and developed to expose the HSG on the top surface of all of the second insulating layer, while the unexposed second photoresist remaining in the first openings protects the first conducting layer having the HSG layer on its surface. For example, the first conducting layer with its HSG layer is removed using plasma etching. The plasma etching is used to remove a portion of the exposed first conducting layer (HSG) on the sidewalls of the second insulating layer. The second photoresist is completely removed, exposing the patterned HSG in the first openings to complete the capacitor bottom electrodes. A thin conformal interelectrode dielectric layer (IDL) is formed on the bottom electrodes. For example, for the IDL a silicon oxide/silicon nitride/silicon oxide (ONO) layer can be formed on the bottom electrodes. Next a second conducting layer is deposited sufficiently thick to fill the first openings and to fill the recessed areas in the second insulating layer. The second conducting layer is polished back to the second insulating layer over the second plug contacts to form the capacitor top electrodes, which are auto-self-aligned to the second insulating layer over the second plug contacts. The auto-self-align results from the polish-back to the top surface of the second insulating layer. This sequence of process steps and novel structure provide an improved overlay margin between the capacitor and the bit-line contacts that are formed next. A third insulating layer is deposited to electrically insulate the capacitor top electrodes. Third openings for bit-line contacts are etched in the third insulating layer and in the second insulating layer aligned over and etched to the second plug contacts. A third conducting layer is deposited to fill the third openings and is polished or etched back to form bit-line contacts. A fourth conducting layer is deposited and patterned to form bit lines over and contacting the bit-line contacts to complete the array of novel memory cells for the DRAM device.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The method for making these stacked capacitors with improved overlay margins between the bit lines and the capacitor top electrodes for DRAM devices is now described in detail. The invention utilizes a novel photomask and sequence of process steps to auto-self-align the capacitor top electrodes to a portion of an insulating layer in which the bit-line contact openings are etched. The current invention avoids polishing back through the interface between the top and bottom electrodes, to auto-self align the capacitor to the bit line contact region. Therefore, this improved process results in fewer polish-back defects and provides higher yields over the prior art, while retaining the auto-self-align feature.

Although the method is described for making stacked capacitors on memory cells having N-channel FETs, it should also be well understood by one skilled in the art that by including additional process step, in addition to those described in this embodiment, other types of devices can also be included on the DRAM chip. For example, by forming N-well regions in a P doped substrate, P-channel FETs can also be provided to form Complementary Metal-Oxide-Semiconductor (CMOS) circuits, such as required for peripheral circuits on the DRAM chip.

Figure 1:
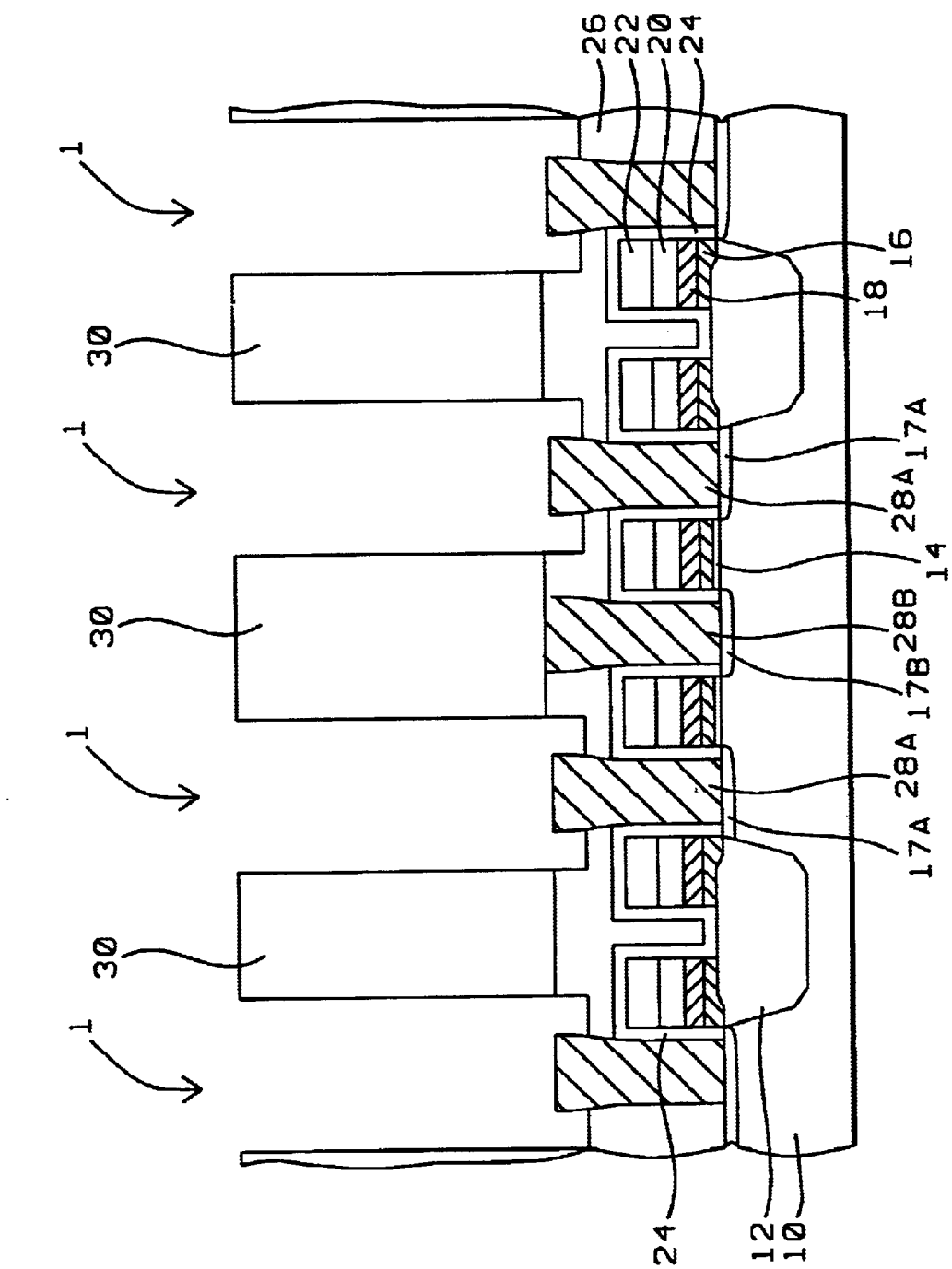
FIGS. 1–13 show schematic cross-sectional views for the sequence of process steps for making a capacitor-under-bit-line (CUB) DRAM cell with improved overlay margin between the bit lines and capacitor top electrodes.

Referring first to FIG. 1, a schematic cross-sectional view of a portion of a semiconductor substrate 10 is shown having partially completed DRAM cells. These partially completed DRAM cells are only described briefly since they are not essential for describing the novel features of this invention. The substrate 10 is typically composed of a lightly doped P type single-crystal silicon having a <100> crystallographic orientation and having an array of memory cell areas surrounded and electrically isolated by shallow trench isolation (STI) regions 12. The cross section through the DRAM cell area shows a series of closely spaced gate electrodes for N-channel FETs. A gate oxide, not shown, is formed on the device areas for the FETs. Next a stacked layer of doped polysilicon 16, a metal silicide layer 18, a cap oxide layer 20, and a nitride layer 22 are deposited sequentially, and patterned to form the FET gate electrodes (16,18) having the cap layer comprised of layers 20 and 22. Source/drain contact areas 17 are formed in the substrate 10 adjacent to the FET gate electrodes (16,18) by ion implantation of a N type dopant, such as arsenic or phosphorous. A conformal silicon nitride ($Si_3N_4$) layer 24 is deposited to form a liner/barrier layer. Typically the liner 24 is deposited by LPCVD to a thickness of between about 500 and 1500 Angstroms.

Still referring to FIG. 1, a first insulating layer 26 is deposited on the substrate and is planarized over the FETs. The first insulating layer is typically silicon oxide ($SiO_2$) deposited by LPCVD using tetraethosiloxane (TEOS) as the reactant gas. Alternatively, dopants such as boron and phosphorus can be added to layer 26 during deposition to form a borophosphosilicate glass (BPSG). The first insulating layer 26 is then planarized, for example, by chemical-mechanical polishing (CMP) to leave a thickness of between about 4000 and 6000 Angstroms over the FET devices.

Next conventional photolithographic techniques and anisotropic plasma etching are used to etch self-aligned contact (SAC) openings in layer 26. The contact openings are etched to the source/drain areas 17A for capacitor nodes, and to the source/drain areas 17B for self-aligned contact openings for the shared bit-line contacts. An electrically conducting material 28 is deposited and polished back to concurrently fill the contact openings to form first conducting plug contacts 28A for capacitors, and to form second plug contacts 28B for the bit lines. Preferably the electrically conducting material 28 is an N doped polysilicon, deposited by LPCVD using a reactant gas containing silane ($SiH_4$) or dichlorosilane ($SiCl_2H_2$), and is deposited to a thickness sufficient to fill the openings. The polysilicon 28 is then polished back to the first insulating layer 26 to form the conducting plugs 28A and 28B.

Continuing with the process, as shown in FIG. 1, a second insulating layer 30 is deposited. Preferably the second insulating layer 30 is $SiO_2$ and is deposited by LPCVD using a reactant gas such as TEOS. The second insulating layer defines the height of the capacitor bottom electrodes and is deposited to a thickness determined by circuit design, and more specifically to a thickness of between about 10000 and 25000 Angstroms. First openings 1 are etched in the second insulating layer 30 aligned over and to the first conducting plug contacts 28A using conventional photolithographic techniques and plasma etching.

Figure 2:
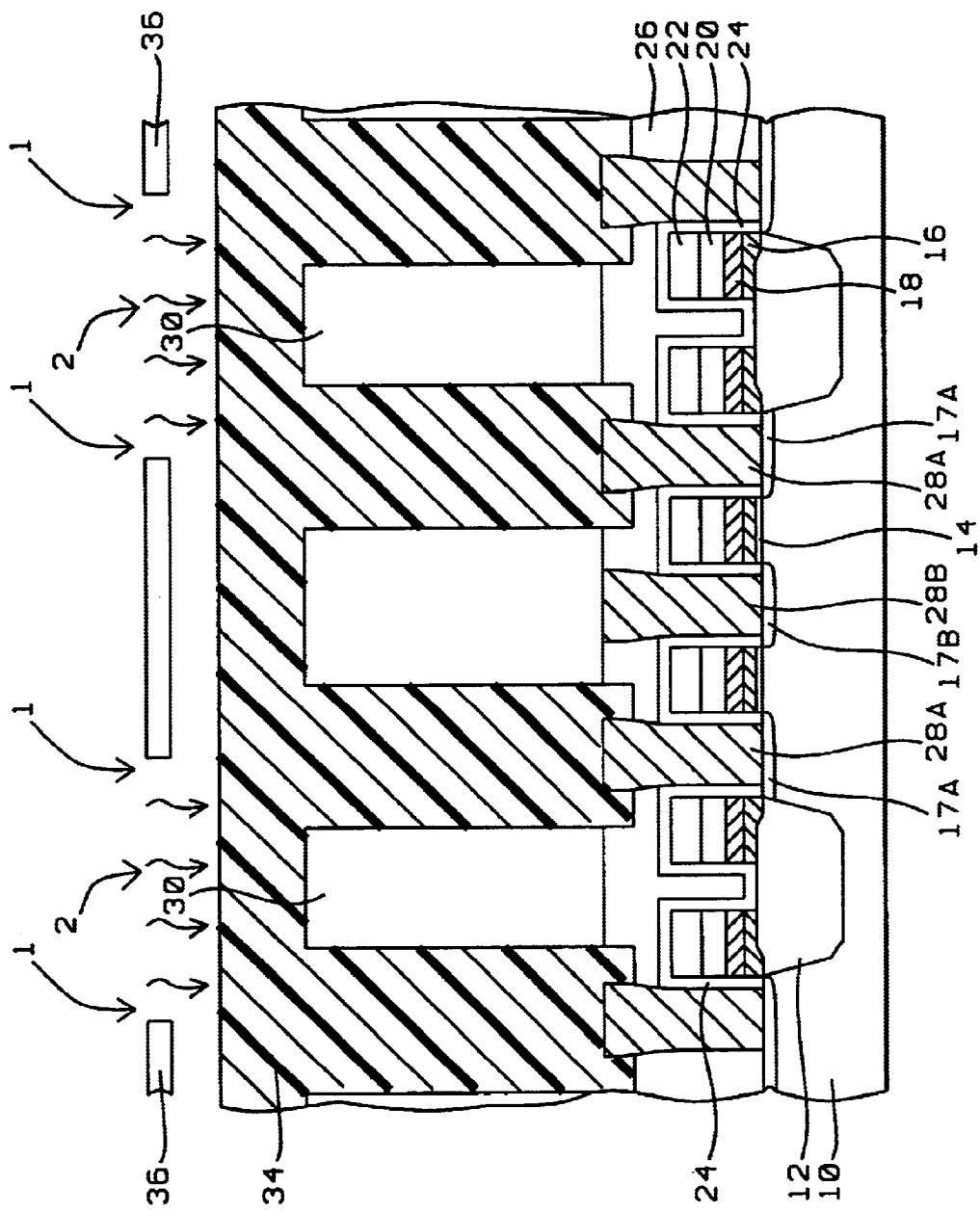

Referring to FIG. 2, a key feature of this invention is to deposit a first photoresist layer 34 sufficiently thick to fill the first openings 1 and to provide an essentially planar top surface over the second insulating layer 30. The first photoresist layer is deposited, for example, by spin coating, and can be either a positive- or a negative-type photoresist, but is preferably a positive-type photoresist.

Still referring to FIG. 2, a photomask 36 having a novel design is used to expose the first photoresist layer 34 to form second openings 2 between adjacent storage nodes (capacitors formed in openings 1). The second openings 2 are formed by partially exposing the first photoresist 34 through the photomask 36.

Figure 3:
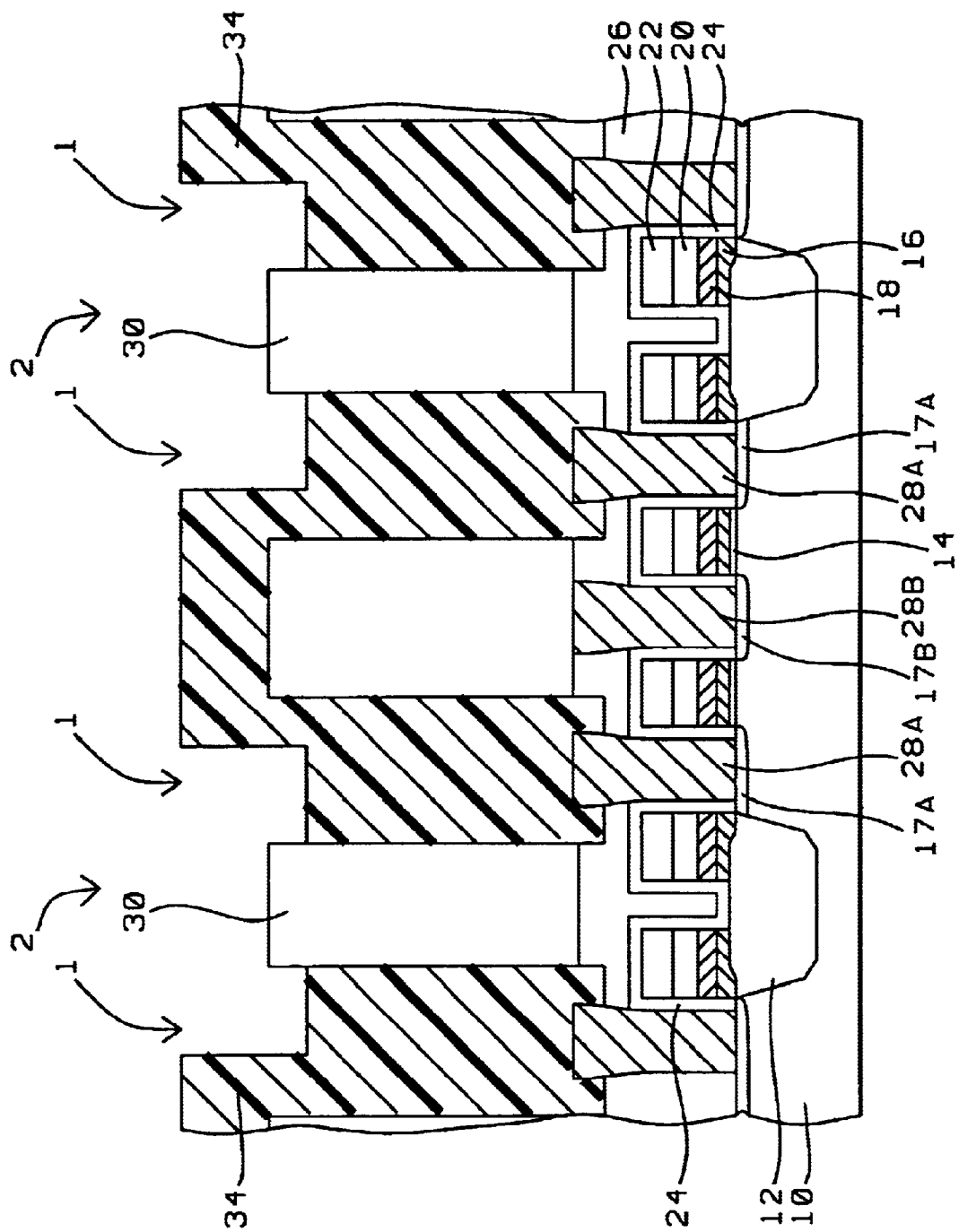

Referring to FIG. 3, after partially exposing the first photoresist 34, the photoresist is partially developed to leave portions of the photoresist 34 on the second insulating layer 30 over the second plug contacts 28B. The openings 2 extend over the edge of the first openings 1. The photoresist 34 is exposed and developed to expose the second insulating layer 30 between the capacitors. The unexposed photoresist 34 is retained over the second plug contacts 28B to protect the second insulating layer 30 from etching.

Figure 4:
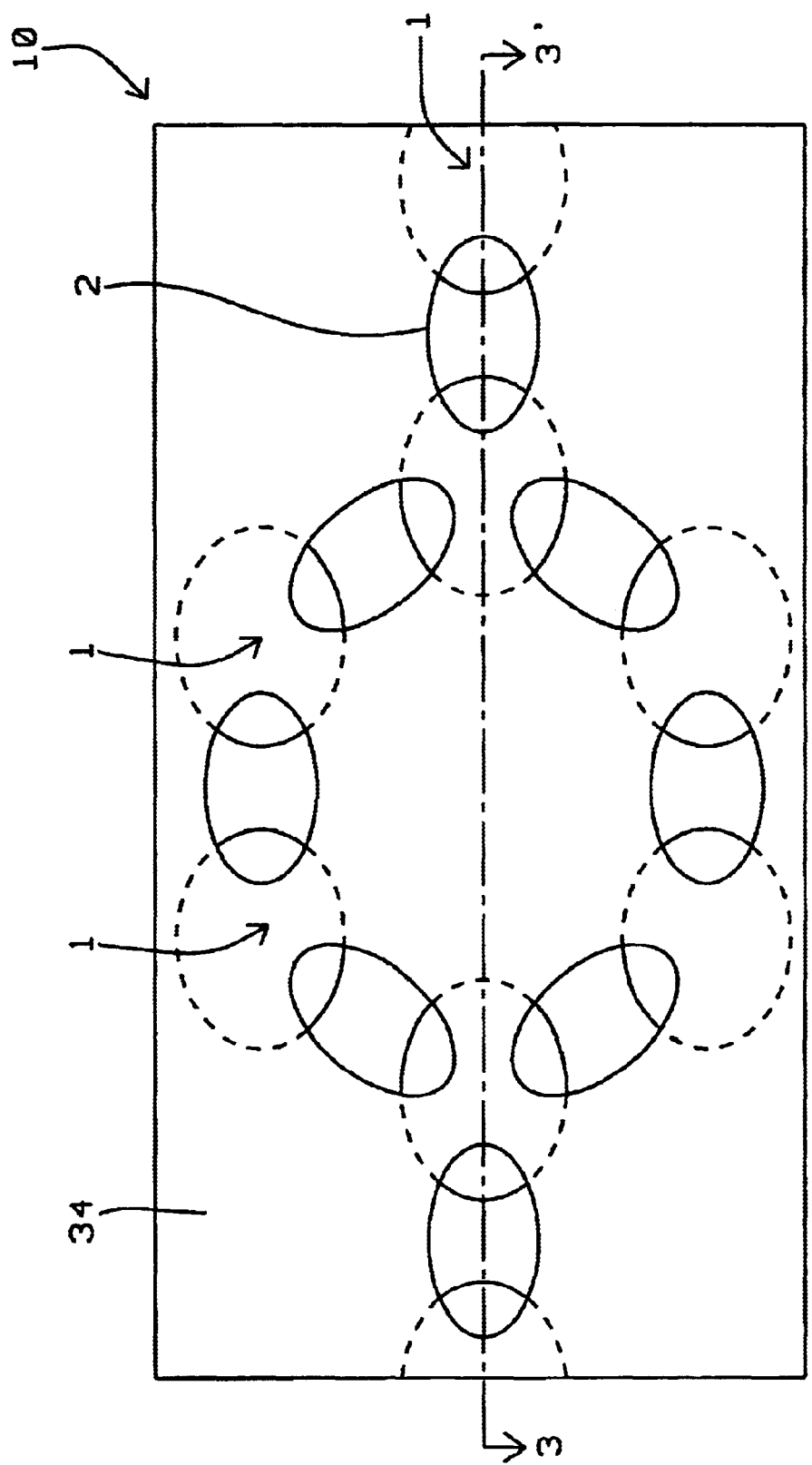

Referring to FIG. 4, a top view of the structure is shown and the region labeled 3—3' is for the cross section in FIG. 3. FIG. 4 shows a top view of the novel photomask 36 (shown in cross section in FIG. 3). The photomask is designed to form the second openings 2 in the photoresist layer 34 between, and extending over the openings 1 for the capacitor bottom electrodes (storage nodes). When the photoresist 34 is partially developed, as shown in FIG. 3, the top surface of the second insulating layer 30 is exposed in the second openings 2.

Figure 5:
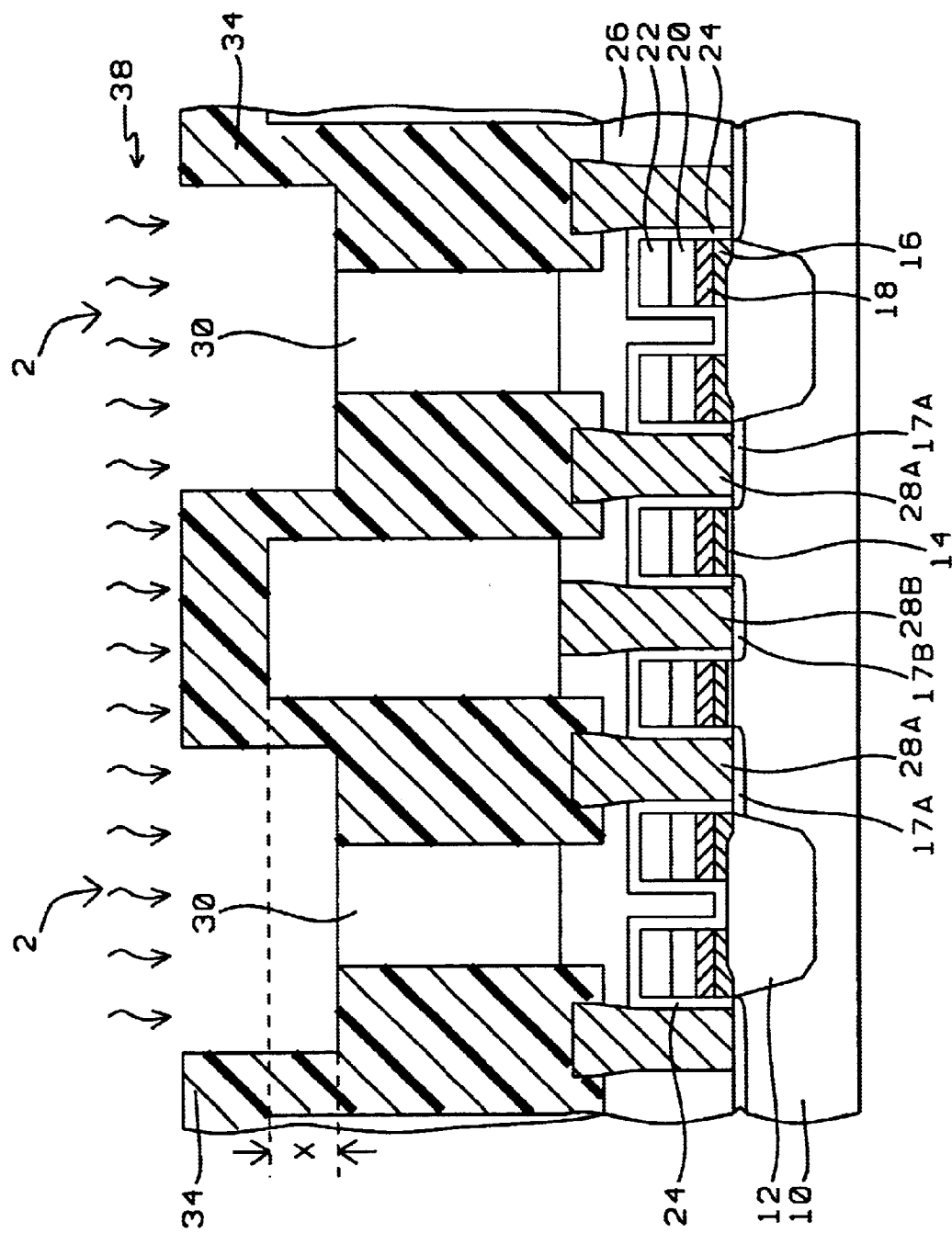

Referring to FIG. 5, the exposed portions of the second insulating layer 30 are recessed to a depth x in the second openings 2. The recess is achieved by using plasma etching as indicated by the vertical arrows 38. The etching is carried out using a high-density plasma etcher and an etchant gas that contains fluorine, such as carbon-tetrafluoride ($CF_4$). The recess x is sufficiently deep to avoid polishing into the bottom electrode, due to polishing variation across the substrate, at a later process step.

Figure 6:
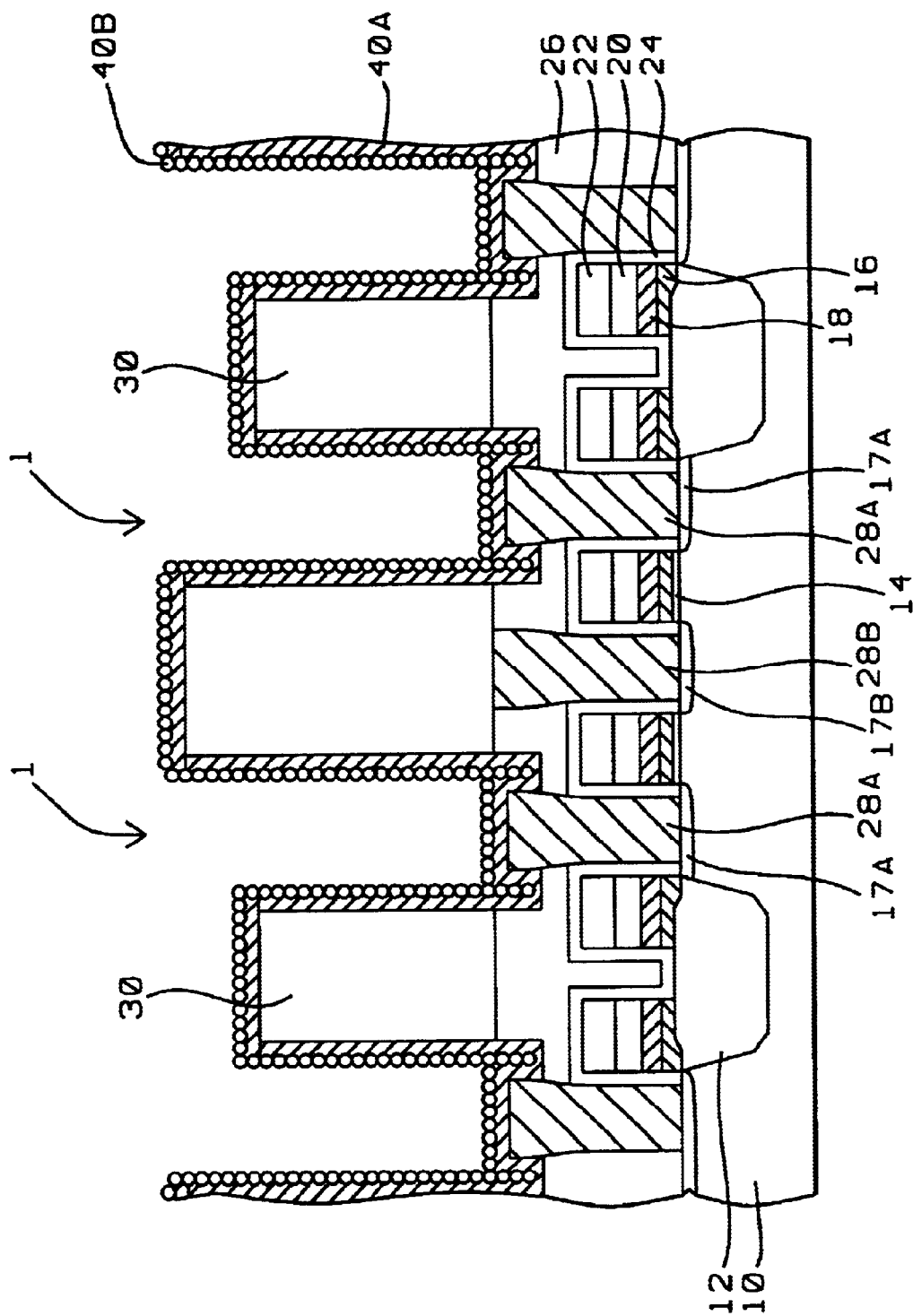

Referring to FIG. 6, the remaining first photoresist 34 is completely removed including the photoresist in the first openings 1. For example, the photoresist can be removed by plasma ashing in oxygen or ozone.

Still referring to FIG. 6, a conformal first conducting layer 40A is deposited over the second insulating layer 30 and in the first openings 1 that will later form the capacitor bottom electrodes 40A in the first openings 1, aligned over and contacting the first conducting plug contacts 28A. The first conducting layer 40A is an in-situ N doped polysilicon, and is deposited to a thickness of between about 300 and 700 Angstroms. Alternatively, layer 40A can be an amorphous silicon layer, which is annealed to form a thin hemispherical silicon grain (HSG) layer 40B on its surface to further increase surface area (capacitance) of the first conducting layer 40A.

Figure 7:
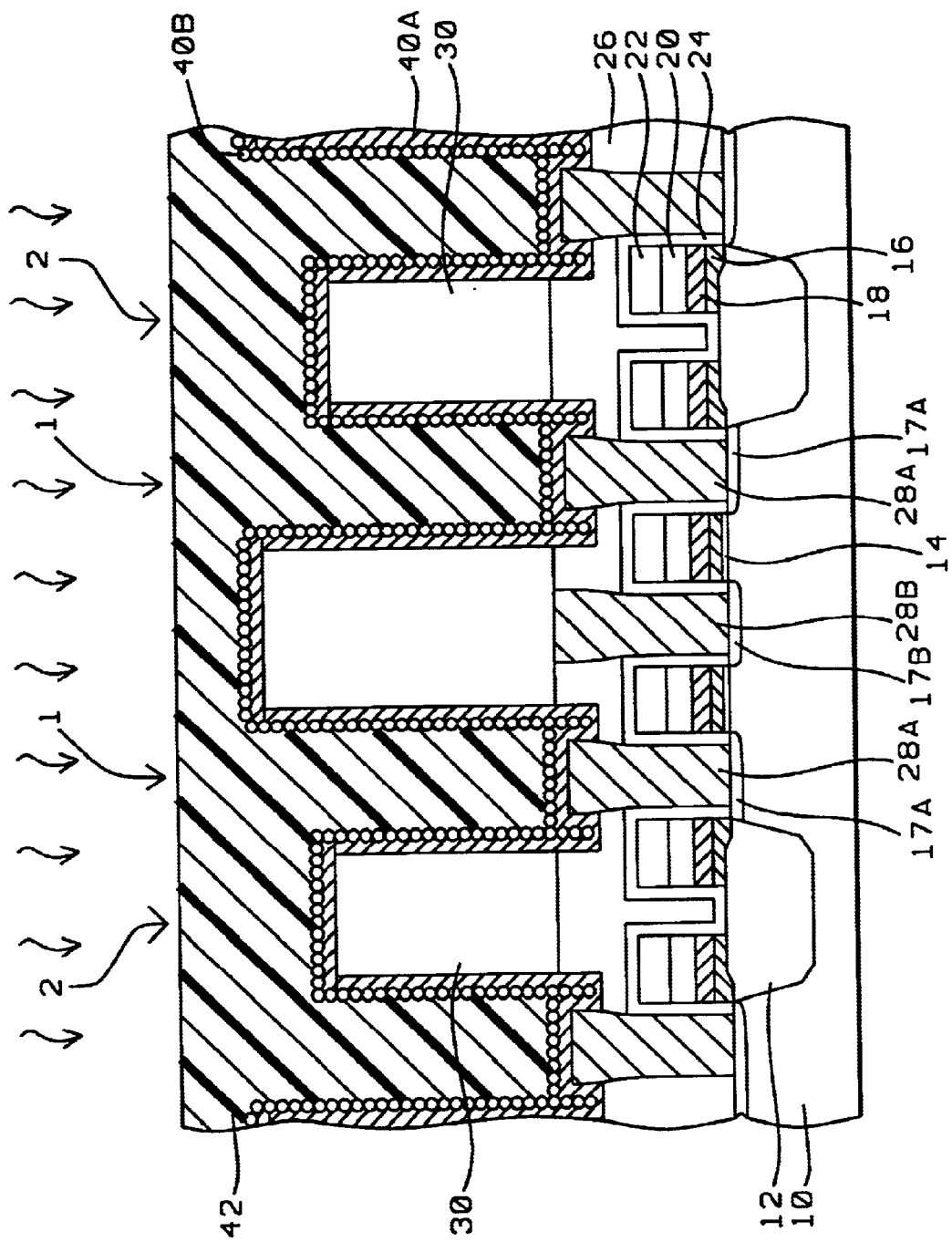
Figure 8:
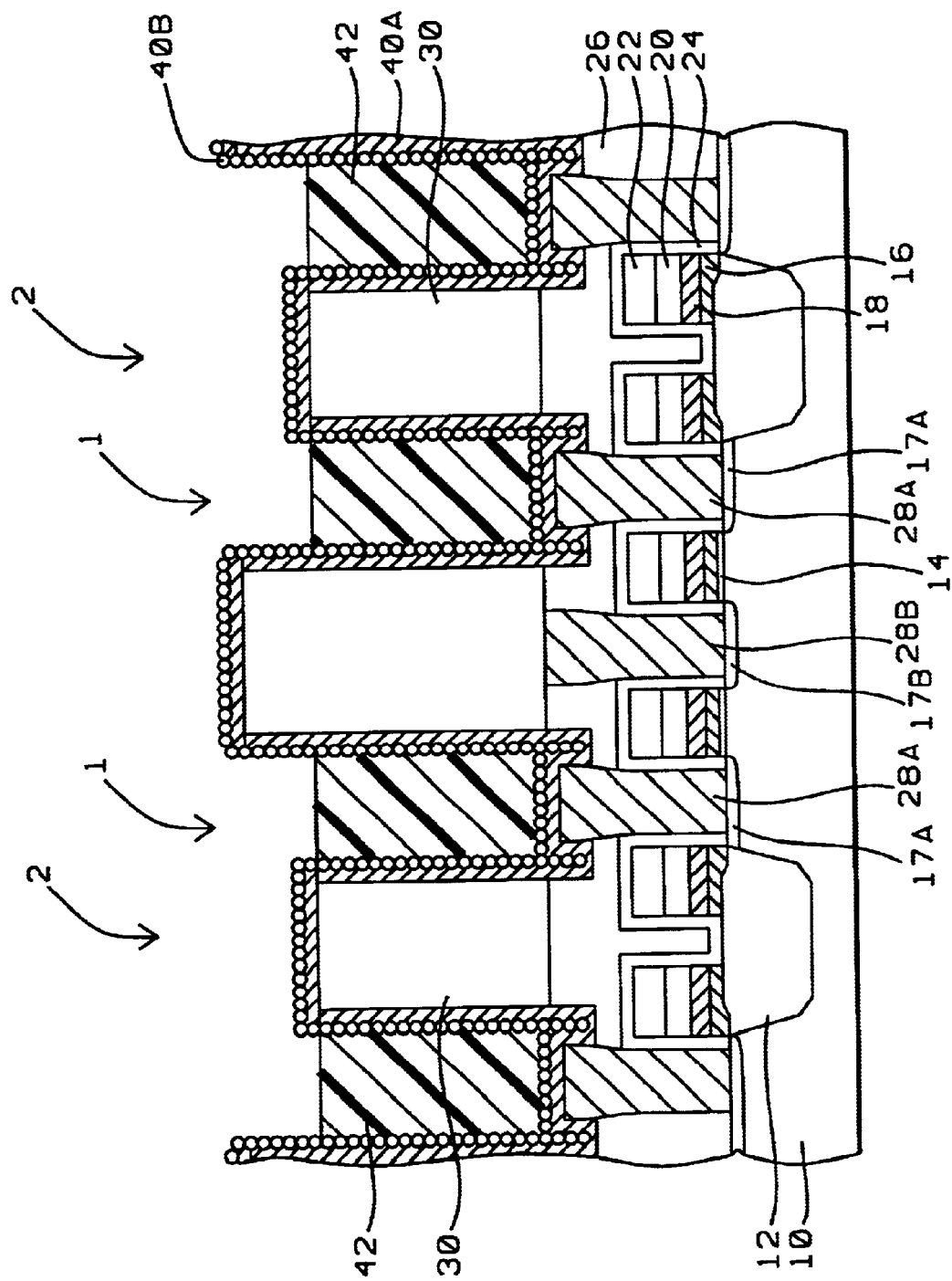

Referring to FIG. 7, a second photoresist layer 42 is deposited to fully cover the substrate 10, which includes filling the first openings 1 and the recessed second insulating layer 30 in the second openings 2, and forming an essentially planar surface on the substrate. The second photoresist 42 is preferably a positive-type photoresist, and is partially exposed to remove a portion of the photoresist 42, sufficient to expose the first conducting layer 40A, with HSG 40B, on the top surfaces of the insulating layer 30 when the photoresist layer 42 is developed. The second photoresist 42 is developed using a conventional photoresist processing to recess the photoresist below the top surface of layers 40A and 40B, as shown in FIG. 8.

Figure 9:
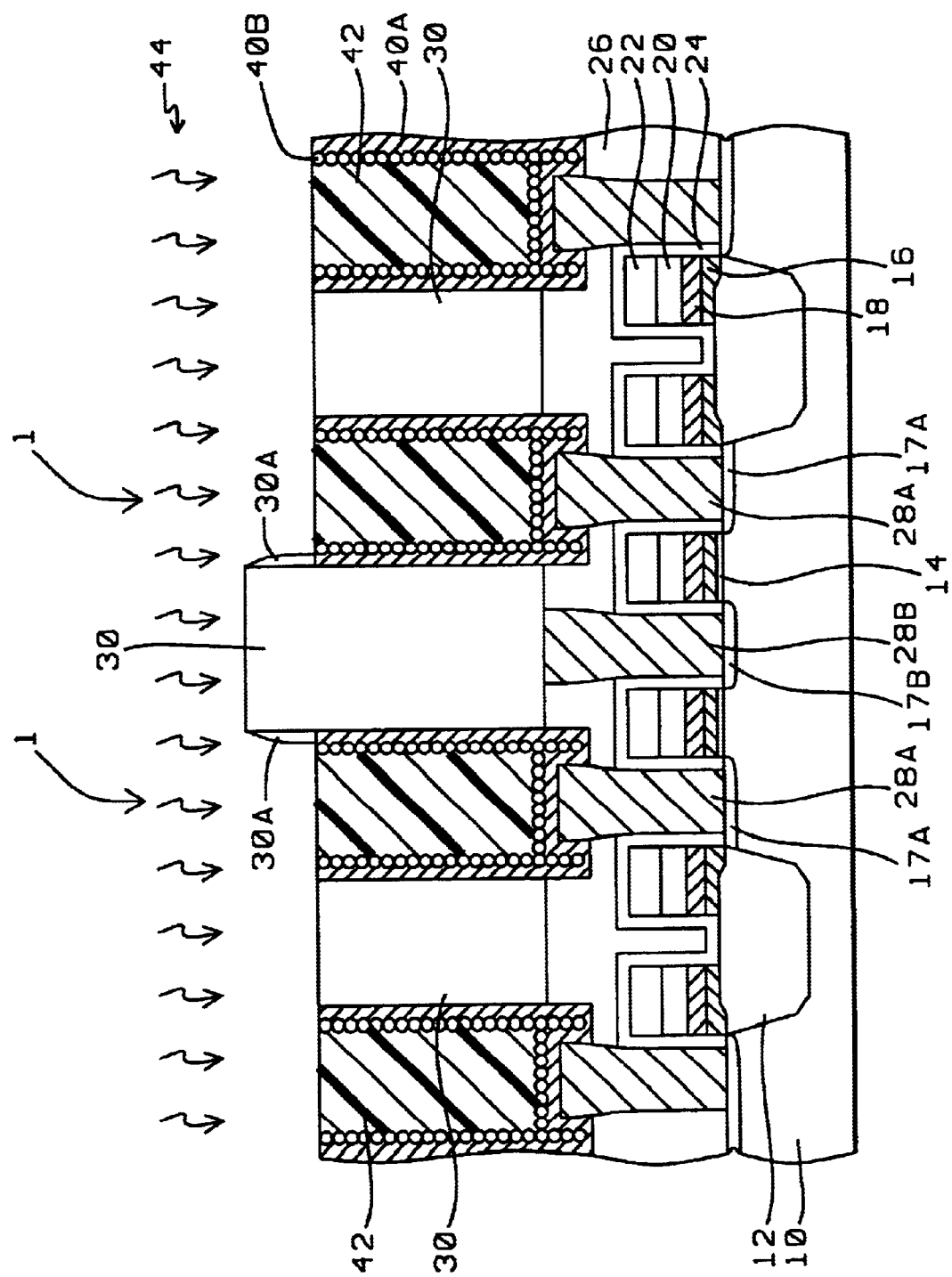

Then as shown in FIG. 9, the first conducting layer 40A and HSG layer 40B are selectively removed on the top surface of the second insulating layer 30, while the remaining second photoresist layer 42 protects the first conducting layer 40A and the HSG layer 40B in the first openings 1. The first conducting layer 40A and the HSG layer 40B are preferably removed by plasma etching, using an etchant gas mixture containing chlorine atoms, as depicted by the vertical arrows 44 in FIG. 9.

Continuing with FIG. 9, and a key feature of this invention is that the etching also removes a portion of layers 40A and 40B on the exposed sidewalls 30A of the second insulating layer 30 around the raised portions of the second insulating layer 30 in which the bit-line contact openings will be made.

Figure 10:
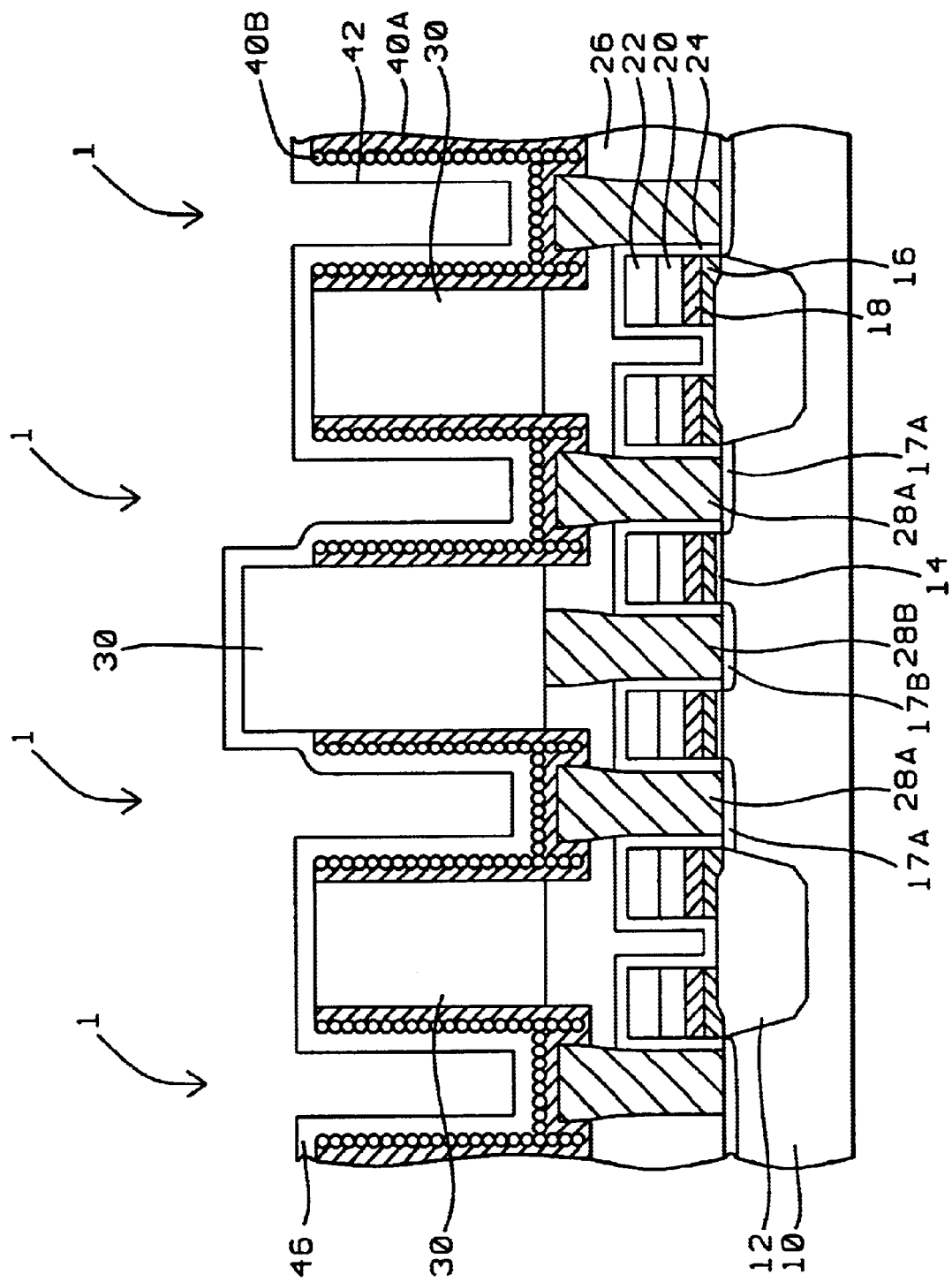

Next, as shown in FIG. 10, the remaining second photoresist layer 42 is completely removed, for example by oxygen ashing, to expose the patterned first conducting layer (composed of layers 40A and 40B) in the first openings 1 to complete the capacitor bottom electrodes.

Still referring to FIG. 10, a thin conformal insulating dielectric layer is formed on the surface of the first conducting layer (40A and 40B) to form the capacitor interelectrode dielectric layer 46. Layer 46 has a high dielectric constant, and is essentially pin-hole free. For example, a silicon oxide-silicon nitride-silicon oxide (ONO) layer can be used for the dielectric layer 46, as is commonly practiced in the semiconductor industry. Also other more exotic materials, such as $Ta_2O_5$, can be used for the dielectric layer. Typically layer 46 is formed to a thickness of less than 100 Angstroms.

Figure 11:
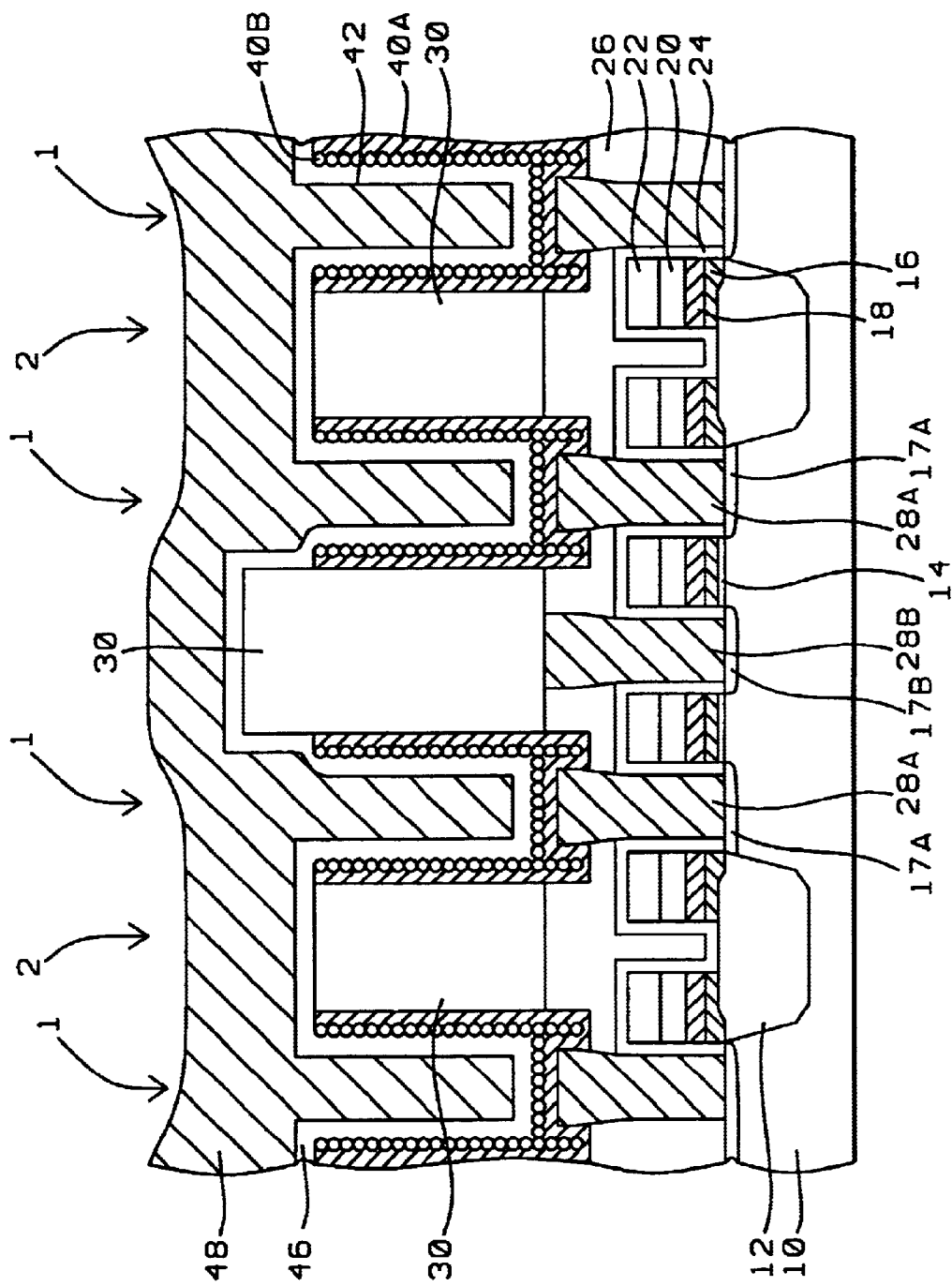

Referring to FIG. 11, a second conducting layer 48 is deposited on the substrate to fill the first openings 1 and the second openings 2, and is sufficiently thick to cover the second insulating layer 30 over the regions where the bit-line contact openings will be formed. Layer 48 is preferably a polysilicon, deposited by LPCVD using $SiH_4$ or $SiCl_2H_2$ as the reactant gas, and is in-situ doped to provide good electrical conductivity.

Figure 12:
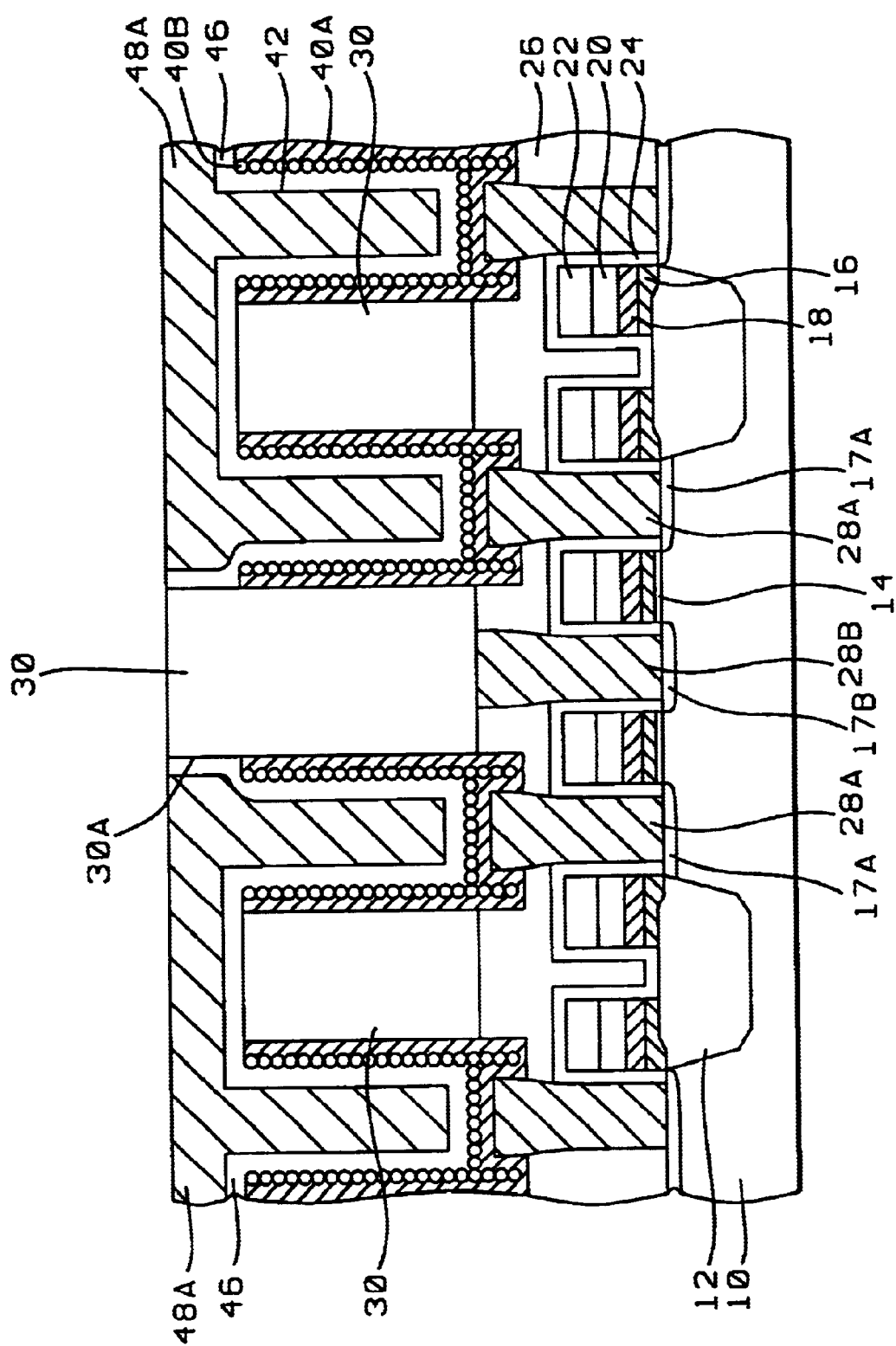
Figure 14:
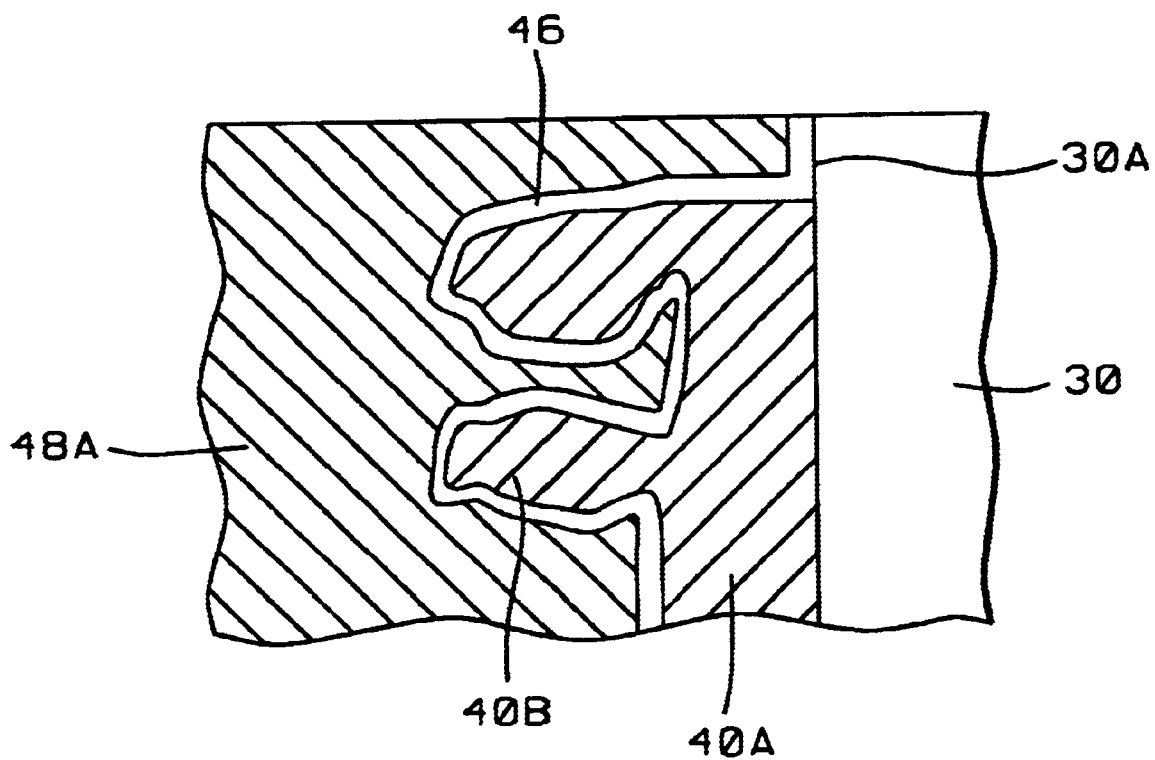
FIG. 14 shows a schematic cross-sectional view of an enlarged portion of the capacitor having improved auto-self-aligned top electrodes to the insulator regions in which bit-line contact openings are made.

Referring to FIG. 12, the second conducting layer 48 is polished back to the top surface of the raised portions of the second insulating layer 30, resulting in capacitor top electrodes 48A that are auto-self-aligned to the second insulating layer 30 in which the bit-line contact openings will be formed. To better appreciate the invention, FIG. 14 shows an enlarged cross-sectional view of the sidewall 30A depicted in FIG. 12. Since the second conducting layer 48 is polished back to the second insulating layer 30, while the capacitor bottom electrode 40A/40B and the thin dielectric layer 46 are recessed at least to a depth of x (see FIG. 5), the polishing does not damage the thin dielectric layer 46 at the interface between the top electrodes 48A and the bottom electrodes 40A/40B.

Figure 13:
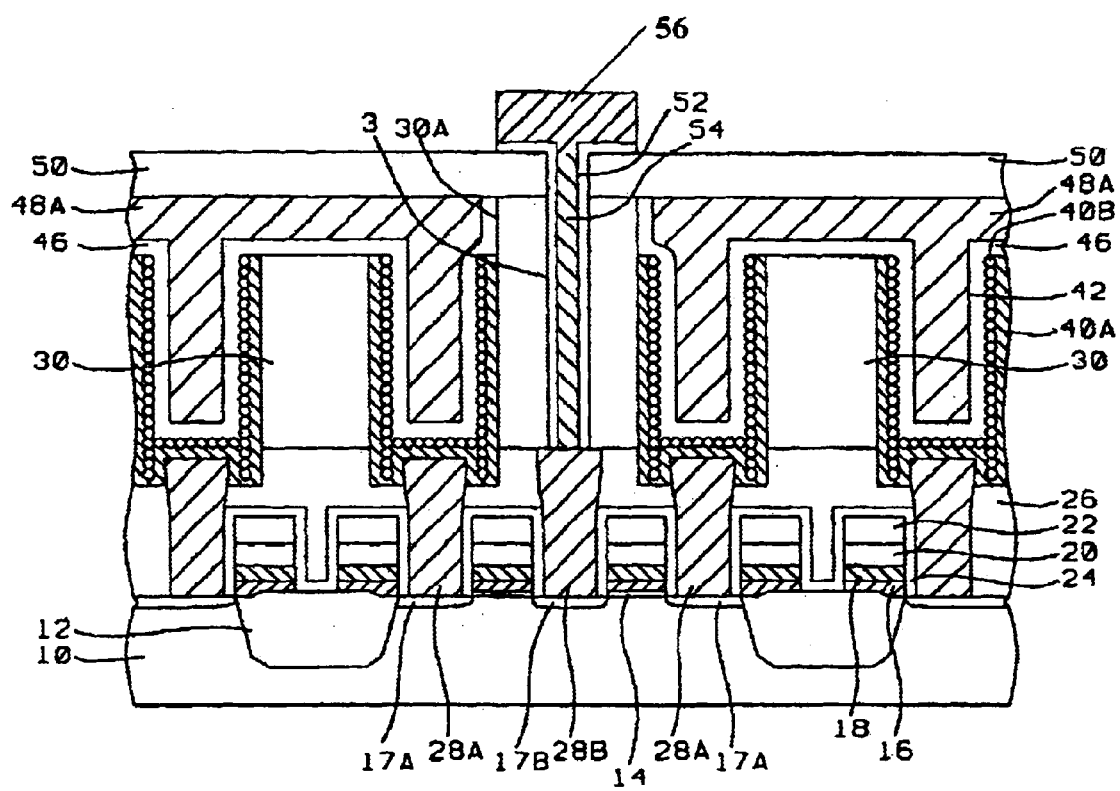

Referring now to FIG. 13, a third insulating layer 50 is deposited to electrically insulate the capacitor top electrodes 48A. Layer 50 is preferably $SiO_2$ and is deposited by LPCVD to a thickness of between about 2000 and 5000 Angstroms. Third openings 3 for bit-line contacts are anisotropically plasma etched in the third insulating layer 50 and in the second insulating layer 30 aligned over and etched to the second plug contacts 28B. A thin barrier/adhesion layer 52 is deposited and a third conducting layer 54 is deposited to fill the second openings 2 and is polished or etched back to form bit-line contacts 54. The barrier/adhesion layer 52 is typically titanium/titanium nitride (Ti/TiN). The third conducting layer 54 is preferably tungsten (W) and is deposited by CVD. The third conducting layer 54 is chemically-mechanically polished back to the third insulating layer 50 using commercially available polishing equipment and an appropriate polishing slurry. A fourth conducting layer 56 is deposited. The fourth conducting layer 56 is preferably aluminum-copper alloy deposited by CVD to a thickness of between about 2000 and 5000 Angstroms. The fourth conducting layer 56 is then patterned using a photoresist mask and anisotropic plasma etching to form bit lines 56. The bit lines are formed over and contacting the bit-line contacts 54 to complete the array of novel memory cells for the DRAM device.

While the invention has been particularly shown and described with reference to the preferred embodiment thereof, it will be understood by those skilled in the art that various changes in form and details may be made without departing from the spirit and scope of the invention.

What is claimed is:

1. An improved process for fabricating an array of memory cells on a dynamic random access memory (DRAM) device comprising the steps of:

providing a substrate having partially completed DRAM devices consisting of an array of device areas surrounded and electrically isolated by field oxide regions, each of said device areas having field effect transistors with gate electrodes and first and second source/drain areas;

depositing a first insulating layer on said substrate;

forming conducting first plug contacts in said first insulating layer to said first source/drain areas for capacitors, and forming conducting second plug contacts to said second source/drain areas for bit-line contacts;

depositing a second insulating layer and forming first openings aligned over and to said first plug contacts;

depositing a first photoresist layer to fill said first openings and having an essentially planar top surface;

forming second openings in said first photoresist layer over portions of said second insulating layer between adjacent said first openings, and further, said second openings extending partially over said first openings and exposing said second insulating layer, and leaving portions of said first photoresist layer aligned over said second plug contacts;

recessing portions of said second insulating layer in said second openings over said first plug contacts;

removing completely remaining portions of said first photoresist layer;

depositing a conformal first conducting layer over said second insulating layer and in said first openings for capacitor bottom electrodes;

depositing a second photoresist layer to fill said first openings and having an essentially planar top surface;

partially removing said second photoresist layer to expose said first conducting layer on top surface of said second insulating layer while retaining portions of said second photoresist layer in said first openings;

removing exposed portions of said first conducting layer on said second insulating layer while protecting said first conducting layer in said first openings;

removing completely said second photoresist layer;

forming an interelectrode dielectric layer on said first conducting layer and on exposed portions of said second insulating layer;

depositing a second conducting layer sufficient to fill said first openings;

polishing back said second conducting layer to said second insulating layer over said second plug contacts to form capacitors having top electrodes auto-self-aligned to said second insulating layer over said second plug contacts;

depositing a third insulating layer;

etching third openings in said third insulating layer and said second insulating layer, said third openings aligned over and etched to said second plug contacts;

forming a third conducting layer in said third openings for bit-line contacts;

depositing and patterning a fourth conducting layer to form bit lines and completing said array of memory cells.

2. The method of claim 1, wherein said first insulating layer is composed of borophosphosilicate glass and is deposited to a thickness of between about 4000 and 6000 Angstroms.

3. The method of claim 1, wherein said conducting first and second plug contacts are composed of polysilicon and are doped N type to a concentration of between about 3.0 E 19 and 5.0 E 20 atoms/cm$^3$.

4. The method of claim 1, wherein said second insulating layer is composed of borophosphosilicate glass and is deposited to a thickness of between about 10000 and 25000 Angstroms.

5. The method of claim 1, wherein said first conducting layer is polysilicon doped with phosphorus to a concentration of between about 1.0 E 18 and 1.0 E 21 atoms/cm$^3$, and is deposited to a thickness of between about 300 and 700 Angstroms.

6. The method of claim 5, wherein a hemispherical shaped grain (HSG) layer is formed on said first conducting layer to increase capacitance.

7. The method of claim 1, wherein said first photoresist layer is patterned by exposing through a photomask and is partially developed to leave portions of said first photoresist layer in said first openings.

8. The method of claim 1, wherein said first conducting layer is removed in a reactive ion etcher using an etchant gas mixture of $Cl_2$, HBr, $O_2$, and He.

9. The method of claim 1, wherein said first photoresist layer is removed by plasma ashing in oxygen.

10. The method of claim 1, wherein said second insulating layer is recessed by partially etching back in a hydrofluoric acid solution.

11. The method of claim 1, wherein said second insulating layer is recessed by partially plasma etching back using an etchant gas of carbontetrafluoride.

12. The method of claim 1, wherein said interelectrode dielectric layer is silicon oxide/silicon nitride/silicon oxide and has a thickness of between about 40 and 80 Angstroms.

13. The method of claim 1, wherein said second conducting layer is polysilicon doped with phosphorus to a concentration of between about 1.0 E 19 and 1.0 E 22 atoms/cm$^3$, and is deposited to a thickness of between about 2000 and 5000 Angstroms.

14. The method of claim 1, wherein said third insulating layer is borophosphosilicate glass and is deposited to a thickness of between about 2000 and 5000 Angstroms.

15. The method of claim 1, wherein said third conducting layer is a multilayer consisting of an adhesion/barrier layer of titanium/titanium nitride and a conducting material of tungsten and is deposited to a thickness sufficient to fill said third openings, and is polished back to form said bit-line contacts.

16. The method of claim 1, wherein said fourth conducting layer is a multilayer consisting of an adhesion/barrier layer of titanium/titanium nitride and a conducting material of aluminum-copper alloy and is deposited to a thickness of between about 2000 and 5000 Angstroms, and is patterned to form said bit lines.

17. An improved process for fabricating an array of memory cells on a dynamic random access memory (DRAM) device comprising the steps of:

providing a substrate having partially completed DRAM devices consisting of an array of device areas surrounded and electrically isolated by field oxide regions, each of said device areas having field effect transistors with gate electrodes and first and second source/drain areas;

depositing a first insulating layer on said substrate;

forming conducting first plug contacts in said first insulating layer to said first source/drain areas for capacitors, and forming conducting second plug contacts to said second source/drain areas for bit-line contacts;

depositing a second insulating layer and forming first openings aligned over and to said first plug contacts;

depositing a first photoresist layer to fill said first openings and having an essentially planar top surface;

forming second openings in said first photoresist layer over portions of said second insulating layer between adjacent said first openings, and further, said second openings extending partially over said first openings and exposing said second insulating layer, and leaving portions of said first photoresist layer aligned over said second plug contacts;

recessing by plasma etching portions of said second insulating layer in said second openings over said first plug contacts;

removing completely remaining portions of said first photoresist layer;

depositing a conformal first conducting layer over said second insulating layer and in said first openings for capacitor bottom electrodes;

depositing a second photoresist layer to fill said first openings and having an essentially planar top surface;

partially removing said second photoresist layer to expose said first conducting layer on top surface of said second insulating layer while retaining portions of said second photoresist layer in said first openings;

removing exposed portions of said first conducting layer on said second insulating layer while protecting said first conducting layer in said first openings;

removing completely said second photoresist layer;

forming an interelectrode dielectric layer on said first conducting layer and on exposed portions of said second insulating layer;

depositing a second conducting layer sufficient to fill said first openings;

polishing back said second conducting layer to said second insulating layer over said second plug contacts to form capacitors having top electrodes auto-self-aligned to said second insulating layer over said second plug contacts;

depositing a third insulating layer;

etching third openings in said third insulating layer and said second insulating layer, said third openings aligned over and etched to said second plug contacts;

forming a third conducting layer in said third openings for bit-line contacts;

depositing and patterning a fourth conducting layer to form bit lines and completing said array of memory cells.

18. The method of claim 17, wherein said first insulating layer is composed of borophosphosilicate glass and is deposited to a thickness of between about 4000 and 6000 Angstroms.

19. The method of claim 17, wherein said conducting first and second plug contacts are composed of polysilicon and are doped N type to a concentration of between about 3.0 E 19 and 5.0 E 20 atoms/cm$^3$.

20. The method of claim 17, wherein said second insulating layer is composed of borophosphosilicate glass and is deposited to a thickness of between about 10000 and 25000 Angstroms.

21. The method of claim 17, wherein said first conducting layer is polysilicon doped with phosphorus to a concentration of between about 1.0 E 18 and 1.0 E 21 atoms/cm$^3$, and is deposited to a thickness of between about 300 and 700 Angstroms.

22. The method of claim 21, wherein a hemispherical shaped grain (HSG) layer is formed on said first conducting layer to increase capacitance.

23. The method of claim 17, wherein said first photoresist layer is patterned by exposing through a photomask and is partially developed to leave portions of said first photoresist layer in said first openings.

24. The method of claim 17, wherein said first conducting layer is removed in a reactive ion etcher using an etchant gas mixture of $Cl_2$, HBr, $O_2$, and He.

25. The method of claim 17, wherein said first photoresist layer is removed by plasma ashing in oxygen.

26. The method of claim 17, wherein said plasma etching of said second insulating layer is carried out using an etchant gas of carbon tetrafluoride.

27. The method of claim 17, wherein said interelectrode dielectric layer is silicon oxide/silicon nitride/silicon oxide and has a thickness of between about 40 and 80 Angstroms.

28. The method of claim 17, wherein said second is conducting layer is polysilicon doped with phosphorus to a concentration of between about 1.0 E 19 and 1.0 E 22 atoms/cm$^3$, and is deposited to a thickness of between about 2000 and 5000 Angstroms.

29. The method of claim 17, wherein said third insulating layer is borophosphosilicate glass and is deposited to a thickness of between about 2000 and 5000 Angstroms.

30. The method of claim 17, wherein said third conducting layer is a multilayer consisting of an adhesion/barrier layer of titanium/titanium nitride and a conducting material of tungsten and is deposited to a thickness sufficient to fill said third openings, and is polished back to form said bit-line contacts.

31. The method of claim 17, wherein said fourth conducting layer is a multilayer consisting of an adhesion/barrier layer of titanium/titanium nitride and a conducting material of aluminum-copper alloy and is deposited to a thickness of between about 2000 and 5000 Angstroms, and is patterned to form said bit lines.

* * * * *